US010790794B1

(12) United States Patent
Khan. P

(10) Patent No.: US 10,790,794 B1
(45) Date of Patent: Sep. 29, 2020

(54) METHODS AND APPARATUS FOR AN INTERFACE

(71) Applicant: SEMICONDUCTOR COMPONENTS INDUSTRIES, LLC, Phoenix, AZ (US)

(72) Inventor: Athar Ali Khan. P, Kanaka Nagar (IN)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/459,849

(22) Filed: Jul. 2, 2019

(30) Foreign Application Priority Data

Mar. 18, 2019 (IN) .............................. 201911010453

(51) Int. Cl.
| | | |
|---|---|---|
| H03H 7/38 | (2006.01) | |
| H03K 5/24 | (2006.01) | |
| H03K 21/38 | (2006.01) | |
| G01R 19/165 | (2006.01) | |
| H04B 1/04 | (2006.01) | |
| H03K 5/00 | (2006.01) | |
| H04B 1/16 | (2006.01) | |

(52) U.S. Cl.
CPC ......... *H03H 7/38* (2013.01); *G01R 19/16576* (2013.01); *H03K 5/24* (2013.01); *H03K 21/38* (2013.01); *H03K 2005/00013* (2013.01); *H04B 1/04* (2013.01); *H04B 1/16* (2013.01)

(58) Field of Classification Search
None
See application file for complete search history.

(56) References Cited

U.S. PATENT DOCUMENTS

| | | | |
|---|---|---|---|
| 8,212,587 B2 | 7/2012 | Yeung | |
| 8,619,838 B2* | 12/2013 | Hao | H05C 3/00 256/10 |
| 8,645,724 B2 | 2/2014 | Jaramillo | |
| 10,536,301 B2* | 1/2020 | Khan. P | H04L 25/0292 |
| 2010/0105319 A1* | 4/2010 | Yeung | H04L 25/03878 455/18 |
| 2010/0250820 A1* | 9/2010 | Gaalaas | G06F 13/4072 710/305 |
| 2017/0019105 A1* | 1/2017 | Xiao | H03K 19/01750 |

* cited by examiner

*Primary Examiner* — Cassandra F Cox
(74) *Attorney, Agent, or Firm* — The Noblitt Group, PLLC; Hettie L. Haines

(57) ABSTRACT

Various embodiments of the present technology may provide methods and apparatus for an interface. The interface may be configured as a low-voltage interface and provide a redriver connected between a pair of input pads and a pair of output pads. The interface may further provide a signal detection circuit connected to the pair of input pads and configured to bias a pair of input termination resistors connected to the input pads with one of a supply voltage and a regulator voltage. The signal detection circuit may be further configured to enable/disable the redriver for a period of time.

20 Claims, 4 Drawing Sheets

METHODS AND APPARATUS FOR AN INTERFACE

CROSS-REFERENCE TO RELATED APPLICATION

This application is based on and claims the benefit of Indian Provisional Patent Application No. 201911010453, filed on Mar. 18, 2019, the contents of which are incorporated by reference.

BACKGROUND OF THE TECHNOLOGY

Many electrical systems utilize an interface to receive and/or transmit data between a host device and a sink device. Conventional interfaces operate with a supply voltage of 3.3 volts and input termination resistors are biased with the supply voltage and typically act as an AC ground when the host device polls the interface for detection (i.e., confirms a valid load presence). Accordingly, in operation, the host device is able to detect the interface by way of the common mode impedance provided by the parallel combination of input termination resistors. However, at a lower supply voltage, such as 1.8 volts, an internal regulator may be used for biasing the input termination resistors, but the internal regulator does not act as an AC ground when the host device polls the interface, so the host device does not recognize the common mode impedance provided by the internal regulator in series with the resistors. This ability of the host device to detect or otherwise communicate with the interface may be referred to as interoperability. Therefore, it may be desired to provide an interface that operates at a low supply voltage, does not present interoperability issues with the host device, does not increase the overall power use of the system, does not increase the chip size, and does not increase the number of I/O pads.

SUMMARY OF THE INVENTION

Various embodiments of the present technology may provide methods and apparatus for an interface. The interface may be configured as a low-voltage interface providing a redriver connected between a pair of input pads and a pair of output pads. The interface may further provide a signal detection circuit connected to the pair of input pads and configured to bias a pair of input termination resistors connected to the input pads with one of a supply voltage and a regulator voltage. The signal detection circuit may be further configured to enable/disable the redriver for a period of time.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various signal detectors, redrivers, amplifiers, transistors, resistive elements, switching devices, and the like, which may carry out a variety of functions. In addition, the present technology may be practiced in conjunction with any number of electronic systems, such as automotive, aviation, "smart devices," portables, and consumer electronics, and the systems described are merely exemplary applications for the technology.

Methods and apparatus for an interface according to various aspects of the present technology may operate in conjunction with any suitable communication system. For example, and referring to FIG. 1, an exemplary system 100 may comprise a host device 105 (i.e., a source device), an interface circuit 110, and a sink device 115. According to an exemplary embodiment, the host device 105 and interface circuit 110 may be connected by a transmission line, such as a first transmission line 120 and a second transmission line 125, and a coupling capacitor, such as coupling capacitors C1, C2. Furthermore, the interface circuit 110 and the sink device 115 may be connected by a transmission line, such as a third transmission line 130 and a fourth transmission line 135, and a coupling capacitor, such as coupling capacitors C3, C4. Accordingly, the host device 105 and the sink device 115 are connected to each other via the interface circuit 110. The transmission lines 120, 125, 130, 135 may comprise any suitable communication lines, buses, links, wires, cables, and the like for transferring data.

Figure 1:
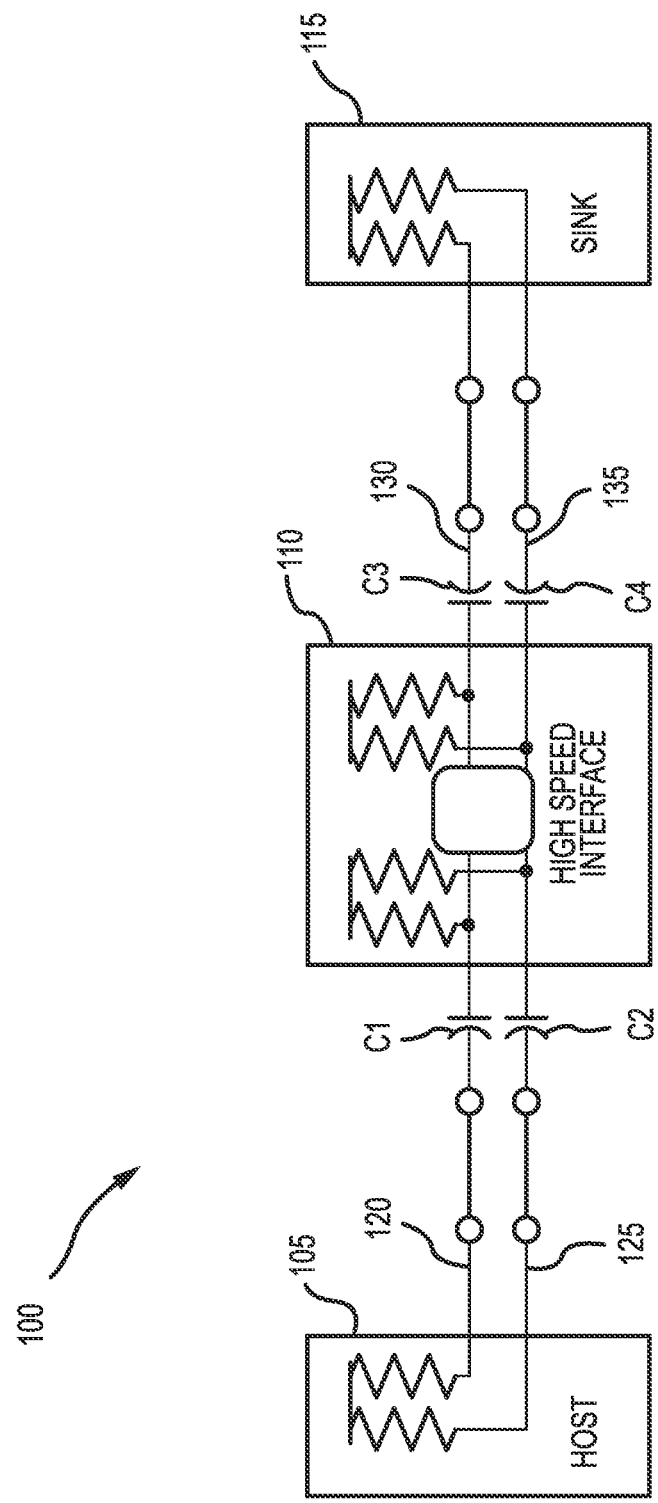
FIG. 1 is a block diagram of a system in accordance with an exemplary embodiment of the present technology.
Figure 2:
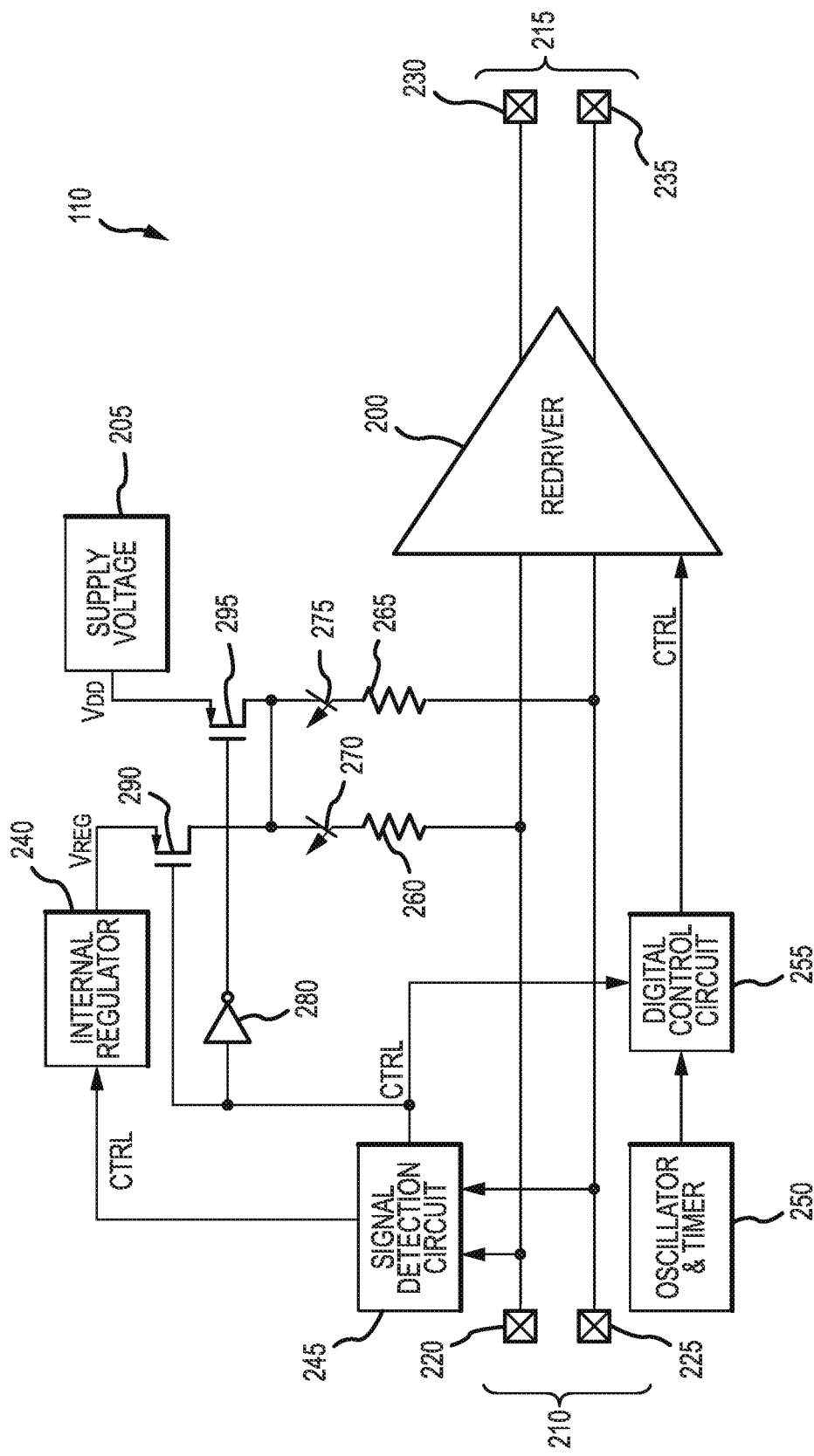
FIG. 2 is a circuit diagram of an interface in accordance with an exemplary embodiment of the present technology.
Figure 3:
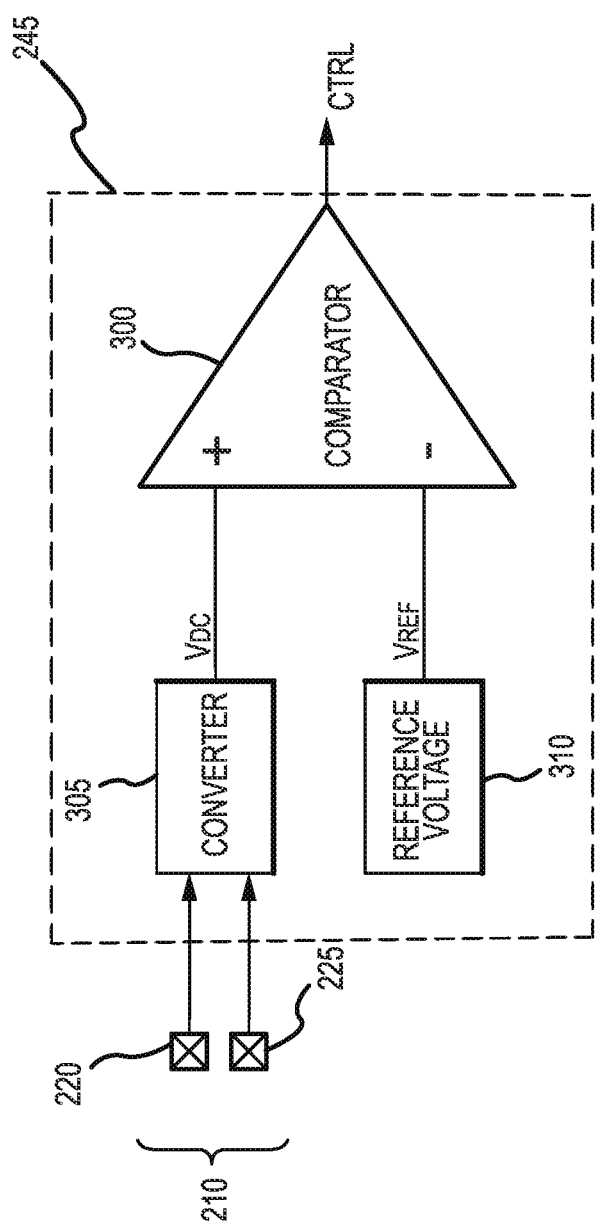
FIG. 3 is a circuit diagram of a signal detection circuit in accordance with an exemplary embodiment of the present technology.
Figure 4:
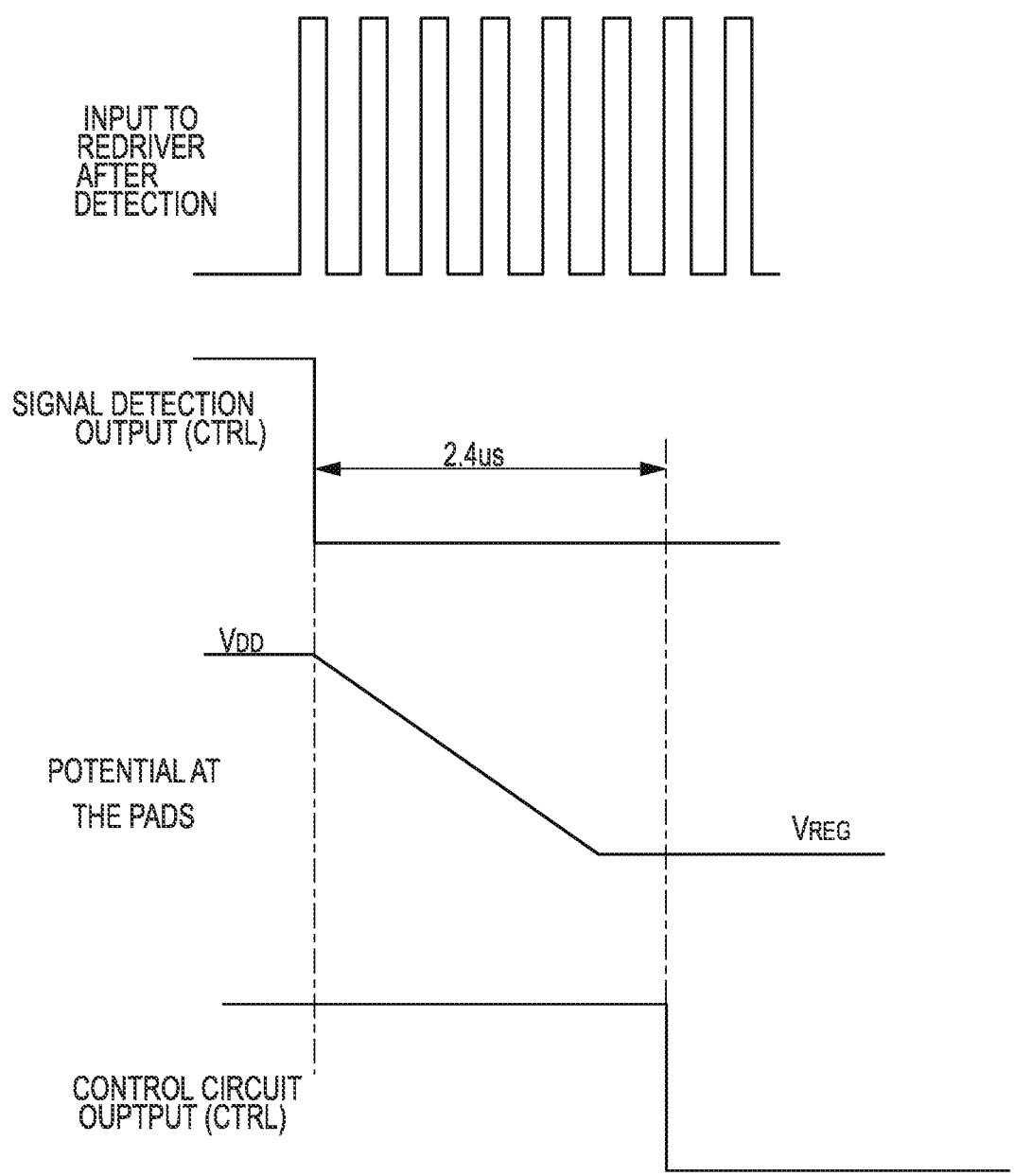
FIG. 4 is a timing diagram of the interface in accordance with an exemplary embodiment of the present technology.

Referring to FIGS. 1-3, the interface circuit 110 may provide high-speed communication (data transmission) at a low voltage across a channel. For example, the interface circuit 110 may be configured to perform at 1.8 volts for data rates of 5 Gbps (gigabits per second), 8.1 Gbps, and 10 Gbps. The interface circuit 110 may be capable of operating according to USB 3.1 SuperSpeed Plus protocol, for example completing related transmission and reception compliance testing at 10 Gbps.

The interface circuit 110 may be configured to regenerate signals to boost the quality of the signal transmitted from the host device 105 to the sink device 115. The interface circuit 110 may also be configured to adjust and correct for known channel losses and restore signal integrity.

According to various embodiments, the interface circuit 110 may selectively bias various terminals to achieve a desired operation and/or improve interoperability between the host device 105 and the interface circuit 110. In addition, the interface circuit 110 may operate according to various modes, such as a high-speed mode (i.e., an active mode) and a power-saving mode (i.e., a slumber mode, a low power mode), such as at 1.8 volts.

According to an exemplary embodiment, the interface circuit 110 may be configured to receive or generate a supply voltage $V_{DD}$. For example, the supply voltage $V_{DD}$ may be generated using any suitable circuit and/or system and may be generated on the same chip as the interface circuit 110 or a companion chip. In addition, the interface circuit 110 may comprise an internal regulator 240, a selector circuit, a first input termination resistor 260, a second input termination resistor 265, and a signal detection circuit 245 that operate in conjunction with each other and the supply voltage $V_{DD}$ to ensure that the host device 105 is able to detect the interface circuit 110.

The internal regulator 240 may be configured to limit or otherwise control a current and/or a voltage to the channel. For example, the internal regulator 240 may generate a regulator voltage $V_{REG}$ that may be varied based on a desired mode of operation of the interface circuit 110. The internal regulator 240 may comprise any circuit and/or system suitable for applying a variable voltage and/or current to the channel.

The channel may be connected to a pair of input pads 210 and a pair of output pads 215. The pair of input pads 210 may comprise two input pads, such as a first input pad 220 and a second input pad 225. Similarly, the pair of output pads 215 may comprise a third output pad 230 and a fourth output pad 235. The pair of input pads 210 may be used to connect the host device 105 to the interface circuit 110, and the pair of output pads 215 may be used to connect the interface circuit 110 to the sink device 115. For example, the pair of input pads 210 may be connected to the first and second transmission lines 120, 125, respectively, and the pair of output pads 215 may be connected to the third and fourth transmission lines 130, 135, respectively.

In various embodiments, the channel may be configured as a uni-directional channel or a bi-directional channel comprising a redriver 200 (i.e., a repeater IC). For example, the interface circuit 110 may transmit data in one direction (e.g., from the host device 105 to the sink device 115) or may transmit data in both directions (e.g., from the host device 105 to the sink device 115 and from the sink device 115 to the host device 105).

According to various embodiments, the redriver 200 may be configured to amplify, compensate for channel loss, and/or apply a desired gain to an input signal. The redriver 200 may be configured as a linear redriver or a non-linear redriver and may comprise any circuit and/or system suitable for providing a desired signal transmission and/or operating specifications, such as an amplifier (not shown), a continuous time linear equalizer (not shown), an output driver (not shown), an output equalizer (not shown), and the like.

According to an exemplary embodiment, the interface circuit 110 may be implemented as a linear redriver for multi-protocol applications, such as USB and/or DisplayPort. According to an exemplary embodiment, input terminals of the redriver 200 may be connected to the pair of input pads 210 and the output terminals of the redriver 200 may be connected to the pair of output pads 215. In addition, the first and second input termination resistors 260, 265 may be connected at the channel between the pair of input pads 210 and the input terminals of the redriver 200.

According to an exemplary embodiment, the signal detection circuit 245 may be configured to monitor or otherwise detect signals on the channel, such as at the first and second input pads 220, 225. In addition, the signal detection circuit 245 may generate a control signal CTRL according to the detected signals. The signal detection circuit 245 may be further configured to transmit the control signal CTRL to the redriver 200, the selector circuit, and/or the internal regulator 240.

According to an exemplary embodiment, the signal detection circuit 245 may comprise a converter 305 connected to the channel at the first and second input pads 220, 225 and receive a first signal (i.e., a first voltage) at the first input pad 220 and a second signal (i.e., a second voltage) at the second input pad 225. The converter 305 may determine a DC voltage $V_{DC}$ based on a difference between a peak magnitude of the first signal and a peak magnitude of the second signal.

The signal detection circuit 245 may further comprise a comparator 300 configured to compare two signals and generate the control signal CTRL based on the comparison. In an exemplary embodiment, the comparator 300 may receive the DC voltage $V_{DC}$ at a first input terminal and a reference voltage $V_{REF}$ at a second input terminal. Accordingly, the control signal CTRL may be based on the DC voltage $V_{DC}$ and the reference voltage $V_{REF}$. For example, the control signal CTRL may be HIGH (e.g., logic "1") if the DC voltage $V_{DC}$ is greater than the reference voltage $V_{REF}$. Alternatively, the control signal CTRL may be LOW (e.g., logic "0") if the DC voltage $V_{DC}$ is less than the reference voltage.

The signal detection circuit 245 may comprise a reference voltage generator 310 configured to generate the reference voltage $V_{REF}$. The reference voltage generator 310 may be formed on the same chip as the interface circuit 110 or on a companion chip. In an exemplary embodiment, the reference voltage generator 310 may be connected to the second input terminal of the comparator 300.

In various embodiments, alternatively, or in addition to the signal detection circuit 245, the interface circuit 110 may comprise a second signal detection circuit (not shown, but identical to the signal detection circuit 245 described above) connected to a pair of output termination resistors (not shown), wherein the pair of output termination resistors are connected to the pair of output pads 215. Accordingly, the second signal detection circuit may be used to bias the pair of output termination resistors, for example, where the interface circuit 110 is arranged as a bi-directional channel.

The interface circuit 110 may further comprise a control circuit 255 responsive to the signal detection circuit 245 and configured to transmit a signal to the redriver 200. According to an exemplary embodiment, the control circuit 255 may be connected to the signal detection circuit 245 and configured to receive the control signal CTRL. The control circuit 255 may be responsive to a timing circuit 250, comprising an oscillator (not shown) and a timer (not shown). For example, the timing circuit 250 may generate a count value according to the oscillator and timer and transmit the count value to the control circuit 255.

The control circuit 255 may be further configured to transmit the control signal CTRL to the redriver 200 after a time delay, which may be in a range of 2 to 3 microseconds (such as 2.4 microseconds), that corresponds to the count value. In addition, the time delay may correspond to at least one of a settling time at the pair of input pads 210 from the supply voltage $V_{DD}$ to the regulator voltage $V_{REG}$ and a predetermined specification of the system 100, such as a USB compliance specification or any other set specification to obtain a desired operation and/or result based on the particular protocol. The control circuit 255 may be configured as a digital circuit or any other circuit suitable for relaying a received signal after a time delay.

The selector circuit may be configured to selectively bias the channel and/or the pair of input pads 210 with a particular voltage and/or provide a high impedance. According to an exemplary embodiment, the selector circuit may comprise a plurality of switching devices connected to the first termination resistor 260 and the second termination resistor 265. The plurality of switching devices may operate in conjunction with the signal detection circuit 245, the regulator 240, and/or the supply voltage $V_{DD}$ to bias the first termination resistor 260 and the second termination resistor 265.

The first termination resistor 260 and the second termination resistor 265 may comprise any suitable resistive element for reducing current and/or voltage and may comprise passive components and/or active components. According to an exemplary embodiment, the first termination resistor 260 may be connected to the first input pad 220 and a first input terminal of the redriver 200 via a first node. Similarly, the second termination resistor 265 may be connected to the second input pad 225 and a second input terminal of the redriver 200 via a second node. Each termination resistor 260, 265 may have a resistance value in range of 40 to 60 ohms. In an exemplary embodiment, the resistance value is 50 ohms.

In an exemplary embodiment, the selector circuit may comprise a first switching device, such as a first transistor 290, connected to the regulator 240 and configured to selectively connect the regulator voltage $V_{REG}$ to the first and second input termination resistors 260, 265, and therefore, bias the first and second input termination resistors 260, 265 with the regulator voltage $V_{REG}$. In an exemplary embodiment, the first transistor 290 may be responsive to the control signal CTRL. For example, the first transistor 290 may comprise a gate terminal connected to an output terminal of the signal detection circuit 245.

The selector circuit may further comprise a second switching device, such as a second transistor 295, connected to the supply voltage $V_{DD}$ and configured to selectively connect the supply $V_{DD}$ to the first and second input termination resistors 260, 265, and therefore, bias the first and second input termination resistors 260, 265 with the supply voltage $V_{DD}$. In an exemplary embodiment, the second transistor 295 may be responsive to an inverse of the control signal CTRL. For example, the second transistor 295 may comprise a gate terminal connected to the output terminal of the signal detection circuit 245 via an inverter 280, wherein the inverter 280 inverts the control signal CTRL.

The selector circuit may further comprise a third switching device 270 connected between the first transistor 290 and the first input termination resistor 260. The selector circuit may further comprise a fourth switching device 275 connected between the second transistor and the second input termination resistor 265. The third and fourth switching devices 270, 275 may be operated according to a second control signal (not shown) generated by the control circuit 255 or a second control circuit (not shown). When the third and fourth switching devices 270, 275 are open (OFF), the first and second input termination resistors 260, 265 act as an open circuit, and therefore, operate in conjunction with each other to provide a high impedance to the pair of input pads 210.

According to various embodiments, each switching device (e.g., the first, second, third, and fourth switching devices) may comprise any device and/or circuit suitable for controlling current flow, such as a bipolar junction transistor, a metal-oxide-semiconductor transistor, and the like.

In alternative embodiments, the interface circuit 110 may provide improved interoperability and maintain low power consumption by implementing one or more of the following: 1) increasing the power of the regulator 240; 2) providing an external regulator (not shown) and additional pins at the chip level; and 3) including external bypass capacitors (not shown) at the input pads 210.

In an embodiment where the power of the regulator 240 is increased, the selector circuit and supply voltage $V_{DD}$ may be omitted. In other words, only the regulator 240 is used to bias the first and second termination resistors 260, 265.

In an embodiment where the external regulator is provided, the regulator 240, supply voltage $V_{DD}$, and selector circuit may be omitted. In such a case, the interface circuit 110 may be equipped with additional pins to connect the external regular to the pair of input pads 210. In other words, only the external regulator, in conjunction with the first and second termination resistors 260, 265, is used to bias the pair of input pads 210.

In an embodiment where external bypass capacitors are provided, the selector circuit and the supply voltage $V_{DD}$ may be omitted. In other words, the regulator 240, in conjunction with the first and second termination resistors 260, 265, is used to bias the pair of input pads 210.

In operation, the signal detection circuit 245 may control or otherwise assist in controlling biasing of the pair of input pads 210 (and the first and second input termination resistors 260, 265) to improve interoperability between the host device 105 and the interface circuit 110 while maintaining a low operating power (e.g., 1.8V).

Referring to FIGS. 1-4, an exemplary operation may comprise biasing the pair of input pads 210 (and the first and second input termination resistors 260, 265), initially, with the supply voltage $V_{DD}$. For example, the second, third, and fourth switching devices 295, 270, 275 may be ON. Biasing the first and second input termination resistors 260, 265 with the supply voltage $V_{DD}$ may be described as the "power-saving mode," and allows the host device 105 to detect the interface circuit 110 since the supply voltage $V_{DD}$ has a higher potential than the regulator voltage $V_{REG}$.

After the host device 105 detects the interface circuit 110, the host device 105 transmits an input signal to the interface circuit 110 at the pair of input pads 210. In addition, the signal detection circuit 245 detects the input signal and generates and transmits the control signal CTRL to the regulator 240, the selector circuit, and the control circuit 255, wherein the control signal CTRL switches the biasing of the first and second input termination resistors 260, 265 from the supply voltage $V_{DD}$ to the regulator voltage $V_{REG}$. For example, the control signal CTRL turns the first transistor 290 ON and turns the second transistor 295 OFF via the inverter 280. Biasing the first and second input termination resistors 260, 265 (and the pair of input pads 210) with the regulator voltage $V_{REG}$ may be described as the "high-speed mode."

After a time delay, the control circuit 255 may transmit the control signal CTRL to the redriver 200, wherein the control signal CTRL enables operation of the redriver 200. In general, the time delay may be the amount of time required for the biasing of the pair of input pads 210 to switch from the supply voltage $V_{DD}$ and settle to the regulator voltage $V_{REG}$, for example 2.4 microseconds.

In various operations, the system 100 may switch back and forth from the "power-saving mode" to the "high-speed mode" any number of times.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. An interface circuit configured to receive a supply voltage, comprising:
   a pair of input pads, comprising a first input pad and a second input pad;
   a first input termination resistor connected to the first input pad;
   a second input termination resistor connected to the second input pad;
   a pair of output pads;
   a redriver circuit connected between the pair of input pads and the pair of output pads;
   a signal detection circuit connected to the pair of input pads and configured to:
      generate a control signal according to a first voltage at the first input pad and a second voltage at the second input pad;
      control an operation of the redriver according to the control signal; and
      control biasing of the first and second input termination resistors according to the control signal.

2. The interface circuit according to claim 1, wherein the signal detection circuit comprises a conversion circuit configured to convert the first voltage and the second voltage to a DC voltage.

3. The interface circuit according to claim 2, wherein the signal detection circuit further comprises a comparator comprising a first input terminal and a second input terminal, wherein the comparator is configured to receive the DC voltage at the first input terminal and a reference voltage at the second terminal.

4. The interface circuit according to claim 3, wherein the comparator generates the control signal according to the DC voltage and the reference voltage.

5. The interface circuit according to claim 1, further comprising an internal regulator connected to the first and second input termination resistors and configured to:
   generate a regulator voltage; and
   provide a first bias to the first and second input termination resistors.

6. The interface circuit according to claim 5, wherein the interface circuit comprises a selector circuit connected between the internal regulator and the supply voltage and configured to selectively connect the regulator voltage and the supply voltage to the first and second input termination resistors according to the control signal.

7. The interface circuit according to claim 6, further comprising a control circuit configured to receive the control signal and transmit the control signal to the redriver after a time delay.

8. The interface circuit according to claim 7, wherein the time delay corresponds to a settling time at the pair of input pads from the supply voltage to the regulator voltage.

9. The interface circuit according to claim 7, further comprising a timing circuit connected to the control circuit and configured to generate a count value, wherein the control circuit is responsive to the timing circuit.

10. The interface circuit according to claim 1, wherein the supply voltage provides a second bias to the first and second input termination resistors.

11. A method for operating an interface circuit having a first input termination resistor and a second input termination resistor, comprising:
   operating the interface circuit in a first mode comprising biasing the first and second input termination resistors with a supply voltage;
   detecting a redriver while the first and second input termination resistors are biased with the supply voltage;
   applying an input signal to the redriver;
   operating the interface circuit in a second mode comprising switching biasing of the first and second input termination resistors from the supply voltage to a regulator voltage; and
   enabling operation of the redriver after biasing the first and second input termination resistors with the regulator voltage.

12. The method according to claim 11, wherein switching biasing of the first and second input termination resistors from the supply voltage to the regulator voltage comprises:

generating a control signal according to a difference voltage between the first and second input termination resistors; and transmitting the control signal to a selector circuit.

13. The method according to claim 12, wherein enabling operation of the redriver comprises transmitting the control signal to the redriver after a time delay.

14. The method according to claim 11, wherein:
the first mode is a slumber mode; and
the second mode is an active mode.

15. A system, comprising:
a host device connected to a sink device via an interface circuit, wherein the interface circuit comprises:
  a redriver circuit connected between a pair of input pads and a pair of output pads;
  a pair of input termination resistors connected to the pair of input pads;
  a regulator configured to:
    generate a regulator voltage; and
    bias the pair of input termination resistors with the regulator voltage;
  a selector circuit connected to the pair of input termination resistors and configured to bias the pair of input termination resistors with one of the regulator voltage and a supply voltage according to a control signal;
  a signal detection circuit connected to the pair of input pads and comprising:
    a conversion circuit configured to generate a DC voltage based on a first voltage and a second voltage at the pair of input pads;
    a comparator configured to:
      receive the DC voltage and a reference voltage;
      generate the control signal according to the DC voltage and the reference voltage; and
      transmit the control signal to the selector circuit;
  a control circuit connected to the signal detection circuit and configured to receive the control signal and transmit the control signal to the redriver after a time delay.

16. The system according to claim 15, wherein the time delay corresponds to at least one of:
a settling time at the pair of input pads from the supply voltage to the regulator voltage; and
a predetermined compliance specification of the system.

17. The system according to claim 15, wherein the selector circuit comprises:
a first transistor connected to:
  an output of the signal detection circuit at a first terminal; and
  the regulator at a second terminal.

18. The system according to claim 15, wherein the selector circuit comprises:
an inverter connected to the signal detection circuit and configured to receive the control signal; and
a second transistor connected to:
  an output of the inverter at a first terminal; and
  the supply voltage at a second terminal.

19. The system according to claim 15, wherein the redriver is configured as a uni-directional redriver.

20. The system according to claim 15, further comprising a timing circuit configured to generate a count value, wherein the control circuit is responsive to the count value and the time delay corresponds to the count value.

* * * * *